United States Patent
Zhang et al.

(10) Patent No.: US 6,852,416 B2
(45) Date of Patent: Feb. 8, 2005

(54) HIGH DIELECTRIC CONSTANT COMPOSITES OF METALLOPHTHALAOCYANINE OLIGOMER AND POLY (VINYLIDENE-TRIFLUOROETHYLENE) COPOLYMER

(75) Inventors: Qiming Zhang, State College, PA (US); Zhongyang Cheng, State College, PA (US); Haisheng Xu, Linköping (SE)

(73) Assignee: The Penn State Research Foundation, University Park, PA (US)

( * ) Notice: Subject to any disclaimer, the term of this patent is extended or adjusted under 35 U.S.C. 154(b) by 78 days.

(21) Appl. No.: 10/121,936

(22) Filed: Apr. 12, 2002

(65) Prior Publication Data

US 2002/0161074 A1 Oct. 31, 2002

Related U.S. Application Data

(63) Continuation-in-part of application No. 10/108,231, filed on Mar. 27, 2002, now Pat. No. 6,787,238.
(60) Provisional application No. 60/283,755, filed on Apr. 13, 2001.

(51) Int. Cl.[7] .................. B32B 27/18; C08L 27/16; H01L 51/30
(52) U.S. Cl. .................. 428/421; 257/40; 524/81; 524/88; 524/544; 524/545; 524/546

(58) Field of Search .................. 428/421; 257/40; 524/81, 88, 544, 545, 546

(56) References Cited

U.S. PATENT DOCUMENTS

6,069,244 A  *  5/2000  Masuda et al. ............. 540/139
6,480,370 B1  * 11/2002  Koning et al. ........... 361/321.2

OTHER PUBLICATIONS

Ferroelectrics, 1990, vol. 109, pp. 303–308, F. Macchi et al. "Effect of Electron Irradiation on the Ferroelectric Transition of P (VDF–TrFE) Copolymers".

Macromolecules 1985, vol. 18, pp. 910–918, Andrew J. Lovinger, "Polymorphic Transformations in Ferroelectric Copolymers of Vinylidene Fluoride Induced by Electron Irradiation".

Nuclear Instruments and Methods in Physics Research, B46 (1990), pp. 334–337, F. Macchi et al., "Micromechanical Properties of Electron Irradiated PVDF–TrFE Copolymers".

* cited by examiner

*Primary Examiner*—Ramsey Zacharia
(74) *Attorney, Agent, or Firm*—Ohlandt, Greeley, Ruggiero & Perle L.L.P.

(57) ABSTRACT

There are disclosed new composite materials having improved electric field induced strain levels, improved electric constants, and having advantageous mechanical properties for use in electrical devices.

29 Claims, 6 Drawing Sheets

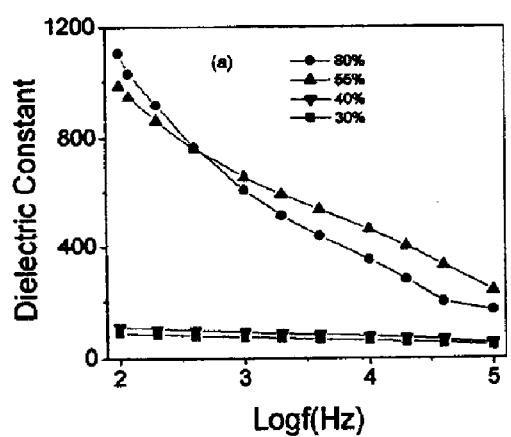 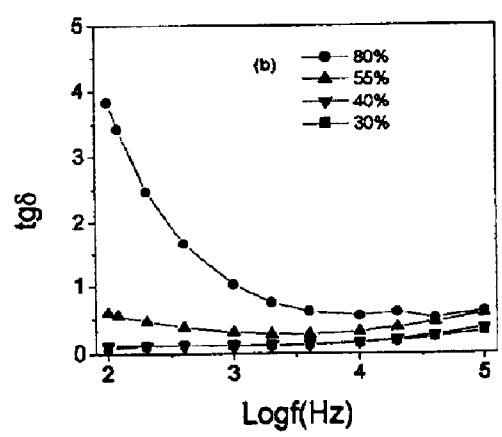
Fig. 2a  Fig. 2b

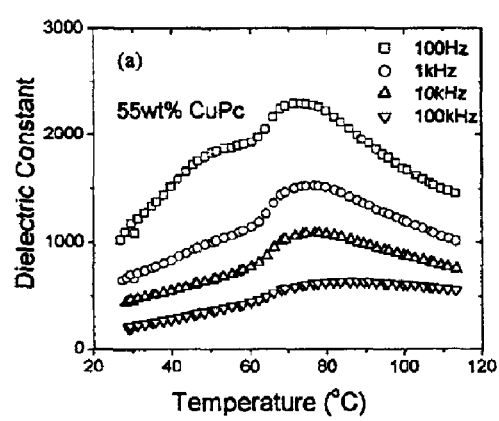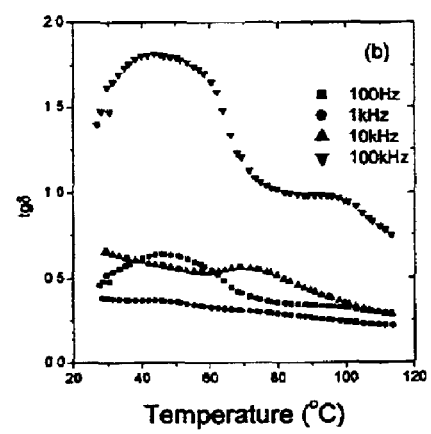
Fig. 5a  Fig. 5b

HIGH DIELECTRIC CONSTANT COMPOSITES OF METALLOPHTHALAOCYANINE OLIGOMER AND POLY (VINYLIDENE-TRIFLUOROETHYLENE) COPOLYMER

This application claims priority from U.S. Provisional Application No. 60/283,755, filed Apr. 13, 2001, and is a continuation-in-part application of U.S. application Ser. No. 10/108,231, now U.S. Pat. No. 6,787,238, filed Mar. 27, 2002, entitled "Terpolymer Systems for Electromechanical and Dielectric Applications".

The United States Government has certain license rights to the invention that is the subject of this application as a result of the development thereof under ONR Grant Nos. N00014-00-1-0623 and N00014-96-1-1173; under NIH Grant No. 1 RO1 HL65959; and under DARPA Contract No. N00173-99-C-2003.

BACKGROUND OF THE INVENTION

1. Field of the Invention

The present invention relates to composite materials with elevated electric field induced strain levels, elevated dielectric constants, and having flexible mechanical properties. The materials of the invention comprise a polymer matrix and high dielectric constant organic material.

2. Description of the Prior Art

Because of their many attractive features such as light weight, high mechanical flexibility, and conformability, electroactive polymers are of great interest for a broad range of applications such as electromechanical and dielectric devices. On the other hand, compared with ceramic materials, the electroactive properties of polymers, such as the dielectric constant and electromechanical response, are not very high. In the past several decades, there has been a great deal of effort to develop polymers with improved functional properties. One of the focuses of these research and development efforts is to raise the dielectric constant of polymers substantially. In addition to applications directly related to capacitors and charge storage devices, a high dielectric constant polymer is also required for high electromechanical responses. The reason behind this is that in the electromechanical transformation process, the mechanical energy output of an electroactive material can't exceed the input electric energy due to the principle of energy conservation. The input electric energy is directly proportional to the dielectric constant of the material and also the square of the applied field. Therefore, in order to develop high performance electroactive polymers for electromechanical applications, one of the key issues is how to substantially raise the dielectric constant of the polymer.

Recently, by making use of high energy electron irradiation, it has been shown that the room temperature dielectric constant of poly(vinylidene-trifluoroethylene) copolymer P(VDF-TrFE) can be increased to about 50, a marked improvement compared with the current available polymers. Elevated dielectric constant PVDF-based terpolymer materials are also developed. However, how to raise the dielectric constant to much higher level without stiffening the polymers is still a challenge. For example, using high dielectric constant ceramics as the filler, the room temperature dielectric constant of the so-called 0–3 composites (ceramic powder polymer matrix composites) can reach 300. One of the consequences of this ceramic filling process to the 0–3 composites is to increase the elastic modulus of the composites significantly above that of the polymer matrix. It is an objective of the present invention to develop alternative 0–3 composite approaches to achieve high dielectric constant while maintain the high flexibility of the matrix. The present invention shows that by making use of the organic solids which possess high dielectric permittivity through the mechanism of nomadic polarization as the fillers, at room temperature and 100 Hz, a composite material with dielectric constant more 1,000 and dielectric loss less than 0.5 can be realized. The composite film is also mechanically flexible with the elastic modulus nearly the same as that of the polymer matrix. In addition, the composite films which elastic modulus is 0.6 GPa also exhibit high strain (~2%) under an electric field of 13 MV/m, a marked improvement compared with other electroactive polymers.

Accordingly, it is an object of the invention to provide polymer matrix materials that exhibit elevated room temperature dielectric constants.

It is another object of the invention to provide polymer matrix materials comprising high dielectric constant material.

It is yet another object of the invention to provide polymer matrix materials having desirable dielectric properties that have mechanical properties similar to their polymer matrix.

These and other objects and advantages of the present invention and equivalents thereof, are achieved by composites useful for electrical applications.

SUMMARY OF THE INVENTION

Using solution casting method, a high dielectric constant composite based on copper-phthalocyanine (CuPc) oligomer and poly(vinylidene fluoride-trifluoroethylene) copolymer is developed. The experimental data show that the low field dielectric constant of the composites (with 55 wt % CuPc) can reach 1,000 and the loss is about 0.5 at room temperature and 100 Hz. Due to the long range electron de-localization in CuPc which results in a strong space charge response of the composite to the external field, there is a strong frequency dispersion of the dielectric properties. In addition, the dielectric properties also exhibit a nonlinear behavior with electric field. One of the uniqueness of the composite is its mechanical properties which remain very much the same as those of the polymer matrix. Even for a composite with 55 wt % CuPc (the volume fraction of CuPc in the composite is also in the similar range), the composite film is still flexible with a Young's modulus of 1.2 GPa at room temperature. Furthermore, it has been demonstrated that in a composite with 40 wt % CuPc filler and relaxor P(VDF-TrFE) matrix, a strain of near 2% can be induced by a field of 13 MV/m while the composite modulus is 0.6 GPa. The strain is proportional to the square of the applied electric field. In addition to the simple composite approach, other approaches to achieve high dielectric constant with metallophthalocyanine oligomer are also discussed.

BRIEF DESCRIPTION OF THE DRAWINGS

FIG. 2a and FIG. 2b are graphs of the dielectric constant and dielectric loss, respectively, of composite films of the invention measured at room temperature. The films have different weight percentage of CuPc filler.

FIG. 5a and FIG. 5b are graphs of the dielectric constant and dielectric loss, respectively, of the composite with 55 wt % CuPc filler at different frequencies.

DETAILED DESCRIPTION OF THE INVENTION

Figure 1:
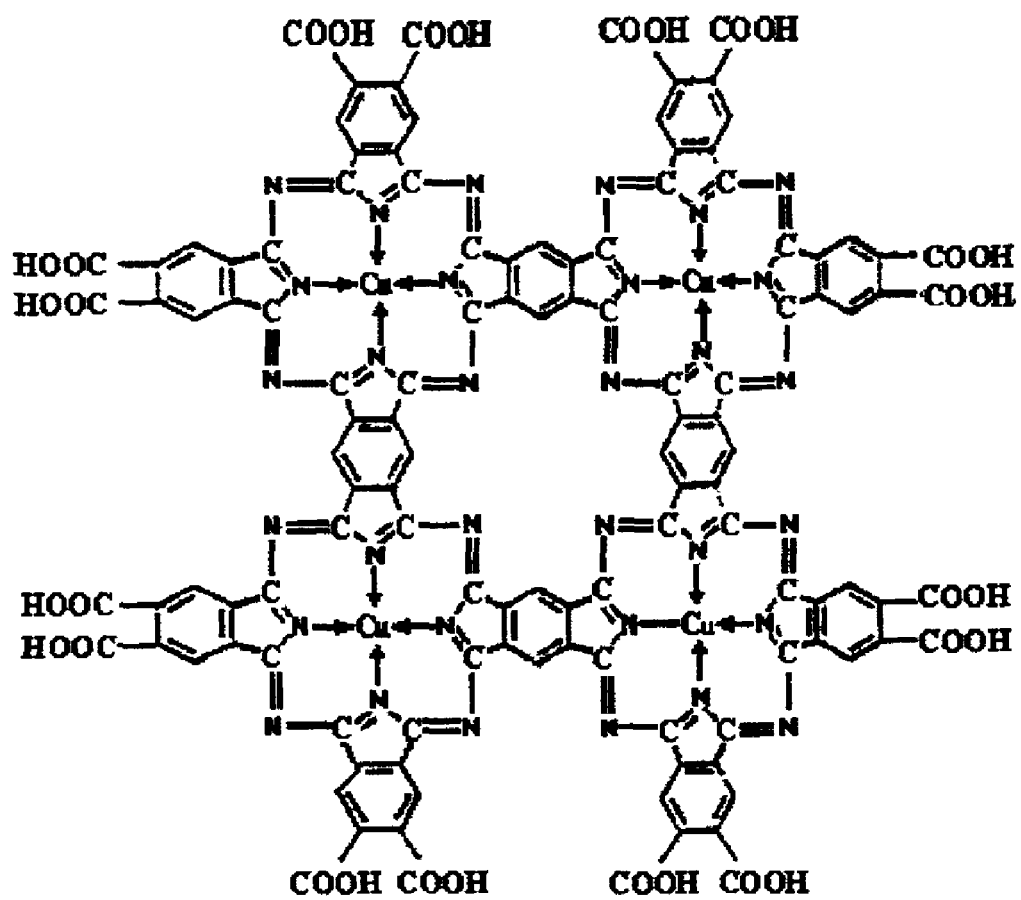
FIG. 1 shows the molecular structure of copper-phthalocyanine (CuPc) oligomer.

The present invention is directed to a polymer based material with preferred, but not necessarily limited to, dielectric constant of higher than 400 while still retaining the flexibility of the polymers, with elastic modulus in the range of polymers (~1 GPa). This class of material has been shown to exhibit high electromechanical properties under low applied field (<20 V/μm).

In electroactive materials, it is well known that when an electric field E is applied to a material with the dielectric constant K and elastic modulus Y, there is an electrostatic force (Maxwell stress) generated strain S:

$$S = K\epsilon_0 E^2 / Y$$

where $\epsilon_0 = 8.85 \times 10^{-12}$ F/m. In addition, the electromechanical conversion efficient of a Maxwell stress based material is also proportional to $KE^2/Y$. In current polymers, because of low dielectric constant (<10), in order to generate large Maxwell strain with high energy conversion efficiency, a material which is very soft (low elastic modulus and in most of the current soft polymers with high strain, the modulus is at or below 10 MPa level) and a very high electric field (>100 V/μm) are required. For almost all practical device applications, it is necessary to reduce the applied field and use polymer systems with a reasonable elastic modulus (~1 GPa). In order, to reach those goals, it is clear from eq. (1) that one should significantly raise the dielectric constant of the material.

Recently, it was also discovered that in modified poly (vinylidene fluoride-trifluoroethylene) (PVDF-TrFE) based polymers, a high electrostrctive strain with high elastic energy density can be achieved (for example 5% strain under 150 V/μm field). One of the issues to further improve the performance of the material is to reduce the driving electric field markedly while still maintain the high strain and high elastic energy density.

Metallophthalocyanine oligomers such as copperphthalocyanine (CuPc) oligomers have been shown to exhibit high dielectric constant (>1,000) and high dielectric loss while elastically is relatively compliant. One of the problems with CuPc is the poor processability. Recently, it has also been shown that poly(vinylidene fluoridetrifluoroethylene) (PVDF-TrFE) based polymers, through proper modifications such as high energy irradiation and terpolymers with selected ter-monomers, exhibit relatively high room temperature dielectric constant (>50) which is by far the highest among the all polymers known and high electrostrictive strain. Therefore, by forming CuPc/PVDF-TrFE composites, one can make use of the very high dielectric constant of CuPc while blocking the dielectric loss due to the high insulation nature of PVDF-TrFE. Furthermore, PVDF-TrFE as the matrix material can also provide good processing capability which also has relatively high dielectric constant and high field induced strain.

Modified poly(vinylidene fluoride-trifluoroethylene) (PVDF-TrFE) based polymers. Ferroelectric polyvinylidine fluoride polymer, that has been processed to exhibit an electrostrictive strain of 4% or more when an electric field strength of 50 megavolts per meter or greater is applied thereacross, has been developed. The processing of the polymer preferably involves subjecting it to either electron beam radiation or gamma radiation. The polyvinylidine fluoride polymer is selected from the group of: polyvinylidine flouride, polyvinylidine fluoride-trifluoroethylene P(VDF-TrFE), polyvinylidine tetrafluoroethylene P(VDF-TFE), polyvinylidine trifluoroethylene hexafluoropropylene P(VDF-TFE-HFE) and polyvinylidine hexafluoropropylene P(VDF-HFE). Such ferroelectric polymers can be prepared by a process comprising the steps of annealing a polyvinylidine fluoride polymer at a temperature at or about 130° C. to about 140° C. for about 16 hours; and irradiating said polyvinylidine fluoride polymer in an oxygen free atmosphere with an energy in the range from about 500 KeV to about 3 MeV to produce a relaxor ferroelectric polymer which exhibits an electrostrictive strain, at room temperature, of 3% or more when an electric field gradient of about 100 megavolts per meter or greater is applied thereacross. The irradiating step is preferably at a temperature from about 25° C. to about 120° C.

Relaxor ferroelectric polymers (polyvinylidene fluoride polymers) are preferably selected from the group consisting of: polyvinylidine fluoride homopolymer, polyvinylidine fluoride-trifluoroethylene P(VDF-TrFE), polyvinylidine fluoride-tetrafluoroethylene P(VDF-TFE), polyvinylidinefluoride trifluoroethylene-hexafluoropropylene (VDF-TFE-HFE) and polyvinylidine fluoride-hexafluoropropylene P(VDF-HFE). In a preferred relaxor ferroelectric polymer the molar percentages of polyvinylidine fluoride/ trifluoroethylene are from about 30/70 to about 75/25 mol %.

Preferred relaxor ferroelectric polymers of electrostrictive polyvinylidine fluoride exhibit an electrostrictive strain, at room temperature, of 3% or more when an electric field gradient of 100 megavolts per meter or greater is applied thereacross. Such relaxor ferroelectric polymers generally exhibit the following properties: a dielectric constant, at room temperature, of greater than 40 at 1 kHz or higher; and an elastic energy density, at room temperature, of greater than 0.3 Joules/cm$^3$ or 160 Joules/kg, which enables avoidance of breakdown at applied field levels thereacross of at least 350 megavolts per meter.

Terpolymers exhibiting high room temperature dielectric constant and high strain. Polymers are prepared by polymerizing a mixture of three monomers comprising: at least one monomer of vinylidene-fluoride; at least one monomer selected from the group consisting of trifluoroethylene and tetrafluoroethylene; and at least one monomer selected from the group consisting of tetrafluoroethylene (if not already present), vinyl fluoride, perfluoro (methyl vinyl ether); bromotrifluoroethylene, chlorofluoroethylene, chlorotrifluoroethylene, and hexafluoropropylene. Polymers of the invention exhibit an electrostrictive strain, at room temperature, of 3% or more when an electric field gradient of 100 megavolts per meter or greater is applied thereacross; exhibit a dielectric constant, at room temperature, of 20 or higher at 1 kHz; and exhibit an elastic energy density, at, room temperature, of 0.3 joules/cm$^3$ or higher, or any combinations thereof.

Terpolymer process. Also, terpolymers may be prepared by a process comprising: polymerizing a mixture of three monomers comprising at least one monomer of vinylidenefluoride; at least one monomer selected from the group consisting of trifluoroethylene and tetrafluoroethylene; and at least one monomer selected from the group consisting of tetrafluoroethylene, vinyl fluoride, perfluoro (methyl vinyl ether), bromotrifluoroethylene, chlorofluoroethylene, chlorotrifluoroethylene, and hexafluoropropylene; stretching said polymer greater than its original length; and thereafter annealing said polymer at a temperature below its melting point, wherein said polymer exhibits an electrostrictive strain, at room temperature, of 3% or more when an electric field gradient of 100 megavolts per meter or greater is applied thereacross, exhibits a dielectric constant, at room temperature, of 40 or higher at 1 kHz, and exhibits an elastic energy density, at room temperature, of 0.3 joules/cm$^3$ or higher, or any combinations thereof.

Ter-polymers include, but are not necessarily limited to, polyvinylidene fluoride-trifluoroethylene-chlorofluoroethylene P(VDF-TrFE-CFE), polyvinylidene fluoride-trifluoroethylene-chlorotrifluoroethylene P(VDF-TrFE-CTFE), polyvinylidene fluoride-tetrafluoroethylene-chlorotrifluoroethylene, polyvinylidene fluoride-trifluoroethylene hexafluoropropylene, polyvinylidene fluoride tetrafluoroethylene hexafluoropropylene, polyvinylidene fluoride-trifluoroethylene-tetrafluoroethylene, polyvinylidene fluoride-tetrafluoroethylene-tetrafluoroethylene, polyvinylidene fluoride-trifluoroethylene-vinyl fluoride, polyvinylidene fluoride tetrafluoroethylene-vinyl fluoride, polyvinylidene fluoride-trifluoroethylene-perfluoro(methyl vinyl ether), polyvinylidene fluoride-tetrafluoroethylene-perfluoro(methyl vinyl ether), polyvinylidene fluoride trifluoroethylene-bromotrifluoroethylene, polyvinylidene fluoride-tetrafluoroethylene-bromotrifluoroethylene, polyvinylidene fluoride-tetrafluoroethylene-chlorofluoroethylene, polyvinylidene fluoride-trifluoroethylene-vinylidene chloride, and polyvinylidene fluoride-tetrafluoroethylene-vinylidene chloride.

CuPc/PVDF-TrFE composites of the present invention can provide high dielectric constant (~1,000 at 100 Hz with a loss at 0.5 level). In addition, a strain which is proportional to $E^2$ of 0.3% can be obtained under a field of 1 V/$\mu$m from the composite with 55 wt % of CuPc. And the composite film is flexible with a elastic modulus 1.2 GPa. By further improving the breakdown field, the strain level can be much higher. For example, for a composite with 40 wt % CuPc and irradiated P(VDF-TrFE) polymer as the matrix, a strain of near 2% is induced under a field of 13 MV/m. The elastic modulus of the composite is 0.6 GPa.

A preferred high dielectric constant semiconductor organic solid used in this invention is a metallophthalocyanine oligomer, copper-phthalocyanine (CuPc) oligomer whose molecular structure is shown in FIG. 1. The CuPc has a room temperature dielectric constant at 100 Hz of more than 1,000 and the dielectric loss is also high. Because of the nomadic polarization mechanism (delocalized electrons lead to the space charge phenomenon), these oligomers suffer high dielectric loss. In addition, they are brittle and difficult to process. The P(VDF-TrFE) based relaxor ferroelectric polymers, which have a relatively high room temperature dielectric constant (~40) after irradiation treatment, is chosen as the matrix. Compared with CuPc, the copolymer has very low dielectric loss and as the matrix, it can provide an insulation layer to CuPc particles to significantly reduce the dielectric loss in the composite.

Synthesis of copier-phthalocyanine oligomer. Copper-phthalocyanine oligomer was synthesized by solution method. Copper sulfate pentahydrate, pyromellitic dianhydride urea, ammonium chloride, and ammonium molybdate were ground together and then placed in a three-necked flask with a thermometer, condenser, and mechanical stirrer. Nitrobenzene was used as solvent and the temperature of reaction solution maintained at 185° C. for 12 h. The as-synthesized solid materials was finely ground and washed with methanol to remove nitrobenzene completely. The powder was boiled with 2N hydrochloric acid saturated with sodium chloride and filtered after cooling to room temperature. The product was neutralized by 2N potassium hydroxide solution containing sodium chloride at 90° C. After centrifugation, the product was dried at room temperature under vacuum.

Sample preparation. The P(VDF-TrFE) based relaxor ferroelectric polymer, either the high energy irradiated copolymer or non-irradiated terpolymer, was used for the polymer matrix. The composite film was prepared by solution casting method. P(VDF-TrFE) copolymer was first dissolved in dimethyl formamide (DMF), and then a proper amount of CuPc powder was added into the solution. After stirring for 12 h at room temperature, the suspension was then poured onto a glass plate and dried at 70° C. for 4 h in air, followed by further drying under vacuum at the same temperature for additional 12 h to remove any remaining traces of the solvent. Composites with weight percentage of the CuPc from 30–80% were prepared.

The free standing composite films of CuPc oligomer and P(VDF-TrFE) copolymer with different weight percentage of CuPc from 30% to 80% were prepared. Since the density of CuPc is close to that of P(VDF-TrFE) copolymer, the wt % is also close to the volume % of the CuPc in the composite. The films prepared are flexible and the Young's modulus of the composite with 55 wt % CuPc was measured to be 1.2 GPa at 250° C., which is close to the Young's modulus of the polymer matrix. Therefore, the 0–3 composites developed here have very attractive mechanical properties compared with the 0–3 composites made of ceramic fillers.

Presented in FIG. 2 is the dielectric constant and loss as a function of the frequency (100 Hz to 100 kHz) measured at room temperature for the composite films containing different CuPc wt %. These results show that the composite films possess high dielectric constant. At 100 Hz and room temperature, the dielectric constant of the composite with 55 wt % CuPc is about 1,000. And even up to 10 kHz, the dielectric constant of the composite with 55 wt % CuPc is still above 500. In the same frequency range, the dielectric loss varies around 0.5, a significant reduction compared with pure CuPc. For the composite film with 80 wt % CuPc, the loss is high at lower frequencies and then decreases as the frequency increases. The results suggest that the conduction behavior of CuPc also contributes to the dielectric response and for composites at high CuPc wt %, there exist resistance percolation.

Figure 3:
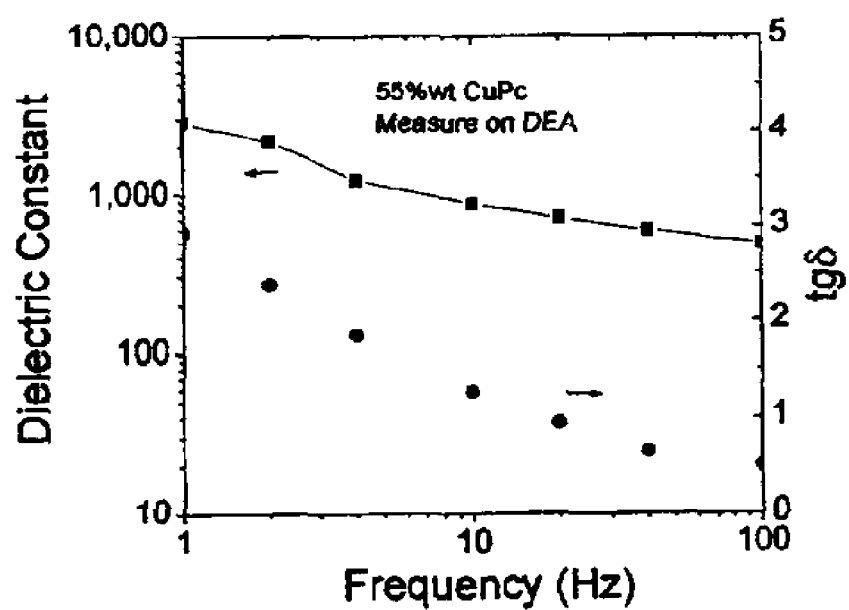
FIG. 3 is a graph of the dielectric properties of composites of the invention having 55 wt % CuPc measured at room temperature in the frequency range from 1 to 100 Hz.

The dielectric constant of the composite with 55 wt % CuPc was also characterized at lower frequencies (1 Hz to 100 Hz) and the result is shown in FIG. 3. The dielectric constant increases continuously as the frequency decreases, and at 1 Hz it reaches 3,000 although the dielectric loss also becomes quite high (~3). These results indicate that the dielectric properties of the composite have strong frequency dispersion, which is a result of the space charge polarization mechanism in CuPc.

The high dielectric constant of CuPc can be explained in terms of the long-range electron orbital delocalization, also called nomadic polarization. Metallophthalocyanine oligomers are highly conjugated and have a large planar structure. The π-electrons are completely delocalized over the entire molecule. In addition, with increased field, there is also an increased probability of electron tunneling between molecules, resulting in a higher dielectric constant and loss. After mixing with P(VDF-TrFE) matrix, the nomadic polarization of CuPc still plays an important role in the composite film, especially for the composite with high percentage of CuPc.

Figure 4:
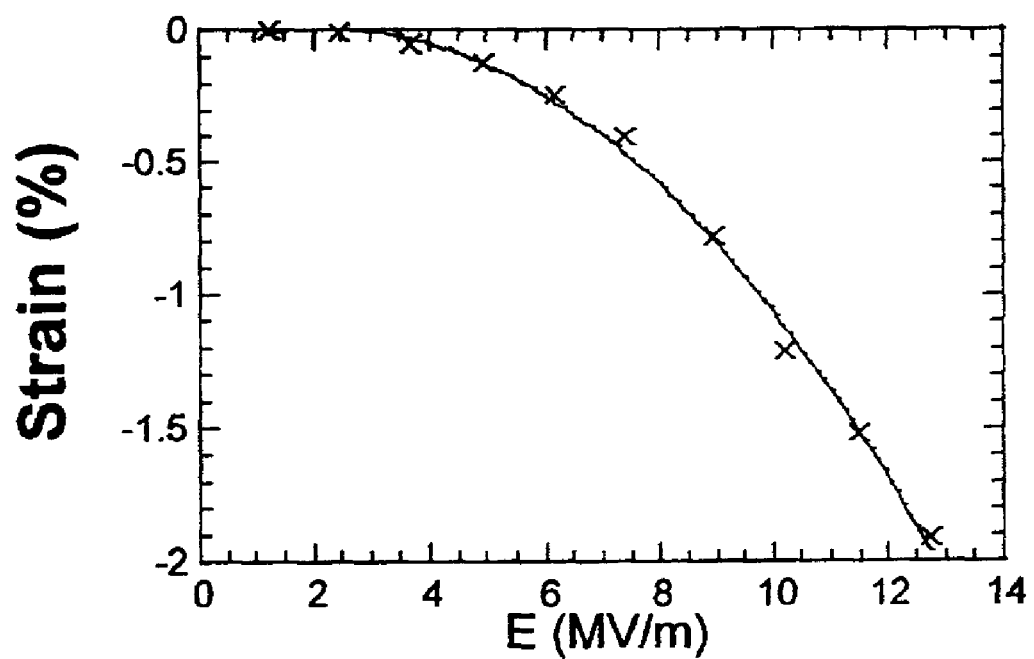
FIG. 4 shows the induced strain of a composite with 40 wt % CuPc filler and the relaxor ferroelectric P(VDF-TrFE) copolymer matrix measured at room temperature and 1 Hz applied field

The composite prepared here also exhibits a high field induced strain, which is proportional to the square of the applied electric field E. Under a field of 10 kV/cm, a strain of 0.3% has been achieved. In the current composites with 55 wt % CuPc, the breakdown field is at about 10 kV/cm (1 MV/m). Therefore, by improving the breakdown field, this composite should exhibit a very high strain response under a relatively low field (10 MV/m, for example). Indeed, a 40 wt % CuPc composite which was electron irradiated (30 Mrads at 1000° C.) exhibits a field induced strain of near 2% under an applied electric field of 13 MV/m (FIG. 4) and the modulus of the composite is 0.6 GPa.

The temperature dependence of the low field dielectric constant and dielectric loss of the composite with 55 wt % CuPc was also investigated and the results are shown in FIG. 5. The data shows that over a relatively broad temperature range, the dielectric constant is quite high, especially at lower frequency, e.g., 100 Hz. A dielectric maximum of about 2,300 (at 100 Hz) was observed at 70° C., which is near the Curie temperature of P(VDF-TrFE) copolymer. For the non-irradiated copolymer, the dielectric constant is 17 at room temperature and 100 Hz and increase with temperature. At the ferroelectric-paraelectric phase transition temperature, which is about 70° C. for the copolymer studied in this article, the copolymer exhibits a dielectric maximum, which is about 50. Therefore the dielectric constant of the composite, which is determined by copolymer and CuPc, also show a dielectric maximum. This is consistent with the results presented in FIG. 5.

In addition to the metallophthalocyanine oligomer as the high dielectric constant filler, there are several other classes of high dielectric constant organic molecules, whose polarization is also based on delocalized electrons, which can also be used as filler: ClAn/Cl$_4$Pa and Pyrene/o-iodoBA, whose molecular structures are illustrated in FIG. 6.

In addition to the P(VDF-TrFE) copolymer as the matrix, other copolymers with dielectric constant higher than 20 can also be used as the matrix of the composites such as the high energy irradiated P(VDF-TrFE) and P(VDF-TFE) copolymers, the PVDF based terpolymers.

Figure 6A:
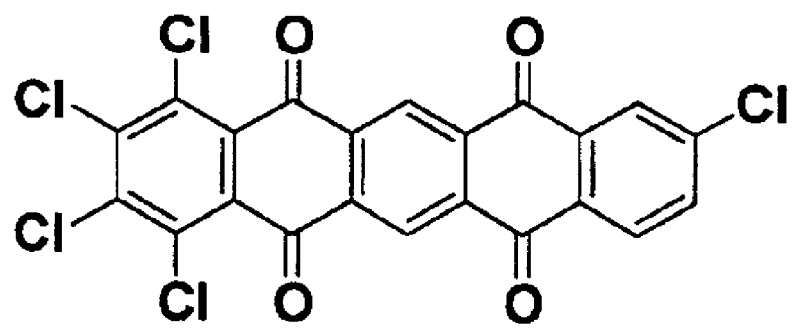
FIG. 6 shows the molecular structure of ClAn/Cl$_4$ and Pyrene/o-iodoBA.
Figure 6B:
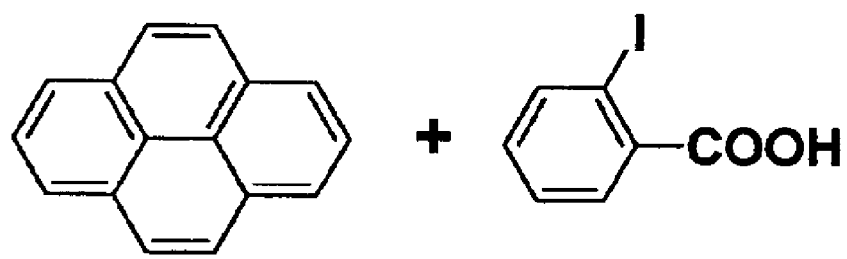

In addition to the metallophthalocyanine oligomer as the high dielectric constant filler, there are several other classes of high dielectric constant organic molecules, whose polarization is also based on delocalized electrons, which can also be used as the filler: ClAn/Cl$_4$Pa, whose molecular structure is illustrated in FIG. 6a (ClAn/Cl$_4$Pa, $\delta_r$=240,000, tg$\delta$= 0.831), and Pyrene/o-iodoBA shown in FIG. 6b (Pyrene/o-iodoBA, $\epsilon_r$=4000, tg$\delta$~0.5).

Additional approaches for high dielectric constant polymers based on metallophthalocyanine oligomer. In addition to the simple mixing approach as presented in the proceeding sections, there are other approaches for dielectric constant polymers based preferably on metallophthalocyanine oligomer which can significantly reduce the loss and raise the breakdown field. In these approaches, CuPc will be directly incorporated into polymer chains at the molecular level. In one approach, CuPc oligomer is grafted with soft polymer chain such as polyethylene glycol (PEG). In CuPc molecule, there are 16 carboxyl groups (—COOH) attached to the CuPc conjugated ring. Those groups can react with hydroxyl group (—OH) on the PEG chain. The dielectric property and mechanical property will depend on how many —COOH groups in CuPc are reacted with PEG and the molecular weight of PEG. For the case when the molecular weight of PEG is high enough, the grafted CuPc can be used directly as composite (liquid crystal polymer type).

CuPc can be directly grafted to PVDF-TrFE polymer chain. The advantage here is that PVDF-TrFE has a relatively high dielectric constant compared with other polymers. In this process, the reaction of PVDF-TrFE copolymer in aqueous NaOH with the use of phase transfer catalyst results in dehydrofluorination. As a consequence, —CH=CF— and CF=CF— double bond units will be formed. The copolymers with double bond units are treated further with peroxidate to form hydroxyl (—OH) group. PVDF-TrFE copolymer with —OH group is then grafted on CuPc by means of esterification.

Another approach addresses the issue of raising the breakdown strength of the composites in which the CuPc powder (or other high dielectric constant semiconductor organic molecular solids) is physically mixed with the polymer matrix. By working with small crystallites (for example, nano-size CuPc fillers) and preventing the formation of agglomerates, the effective field across the grain boundaries will be reduced dramatically which can improve the, dielectric strength markedly. In addition to ultrasonic stirring to be used in the preparation of the composites to break up any possible agglomerates small amount of suitable surfactants can be added to the composites to improve the dispersion of CuPc (or other high dielectric constant semiconductor organic molecule solids) in the polymer matrix.

Another approach is a blocking layer approach. In this approach a blocking layer (such as one layer of P(VDF-TrFE) based electrostrictive polymer (the terpolymer or high-energy electron irradiated copolymer)) will be coated on the composite layer. The breakdown field of a thin layer of irradiated P(VDF-TrFE) polymer has been measured to be above 300 MV/m for a 20 $\mu$m thick film. In this blocking layer approach, the PVDF layer thickness can be ~0.1 $\mu$m. Such a thin layer will have a much higher breakdown field since the breakdown field is inversely proportional to the film thickness due to the avalanche nature of the electric breakdown process. In addition, the thinness of this layer will not affect the dielectric constant of the whole composite very much. The effect of such a blocking layer is very much similar to the principle of the corona poling in which a field much higher than the breakdown filed of the sample to be poled can be applied without causing breakdown because of the limit in the current available.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

What is claimed is:

1. A composite material comprising:
   a polymer matrix; and
   at least one high-dielectric constant organic material having a dielectric constant higher than 1,000;
   wherein said polymer matrix comprises a dielectric constant measured at room temperature of at least 20 when measured in the frequency range from about 1 to about 100 Hz.

2. The composite of claim 1, wherein said high dielectric constant organic material is a semiconductor.

3. The composite of claim 1, wherein said high dielectric constant material comprises at least one material selected form the group consisting of high dielectric constant semiconductor organic solids metallophthalocyanine oligomer, ClAn/Cl$_4$ Pa, and Pyrene/o-iodoBA.

4. The composite of claim 1, wherein said composite exhibits mechanical properties about those of said polymer matrix.

5. The composite of claim 1, wherein said composite is in the form of a film.

6. An electrical device comprising at least one layer of the film of claim 5.

7. The composite of claim 1, wherein said at least one high-dielectric constant material is present in an amount from about 20 wt % to about 80 wt %, of the total weight of the composite.

8. The composite of claim 1, wherein said at least one high-dielectric constant material is present in an amount from about 40 wt % to about 60 wt %, of the total weight of the composite.

9. The composite claim 1, wherein said composite has a dielectric constant higher than 400.

10. A composite material comprising:
    a polymer matrix; and
    at least one high-dielectric constant organic material having a dielectric constant higher than 1.000;
    wherein said polymer matrix comprises at least one ferroelectric polyvinylidine fluoride polymer, that has been processed to exhibit an electrostrictive strain of 3% or more when an electric field strength of 50 megavolts per meter or greater is applied thereacross.

11. The composite of claim 10, wherein said polyvinylidine fluoride polymer is selected from the group of: polyvinylidene fluoride, polyvinylidine tetrafluoroethylene P(VDF-TFE), polyvinylidine trifluoroethylene hexafluoropropylene P(VDF-TFE-HFE) and polyvinylidine hexafluoropropylene P(VDF-HFE).

12. The composite material of claim 10, wherein said polymer matrix comprises a dielectric constant measured at room temperature of at least 20 when measured in the frequency range from about 1 to about 100 Hz.

13. A composite material comprising:
    a polymer matrix; and
    at least one high-dielectric constant organic material having a dielectric constant higher than 1.000;
    wherein said polymer matrix comprises at least one terpolymer comprising: at least one monomer of vinylidene-fluoride; at least one monomer selected from the group consisting of trifluoroethylene and tetrafluoroethylene; and at least one monomer selected from the group consisting of vinyl fluoride, perfluoro (methyl vinyl ether); bromotrifluoroethylene, chlorofluoroethylene, chlorotrifluoroethylene, hexafluoropropylene, and tetrafluoroethylene.

14. The composite of claim 13, wherein said polymer matrix comprises at least one terpolymer selected from the group consisting of:
    polyvinylidene fluoride-trifluoroethylene-chlorotrifluoroethylene P(VDF-TrFE-CTFE), polyvinylidene fluoride-tetrafluoroethylene-chlorotrifluoroethylene, polyvinylidene fluoride-trifluoroethylene-hexafluoropropylene P(VDF-TrFE-HFP), polyvinylidene fluoride-tetrafluoroethylene-hexafluoropropylene, polyvinylidene fluoride-trifluoroethylene-tetrafluoroethylene, polyvinylidene fluoride-trifluoroethylene-vinyl fluoride, polyvinylidene fluoride-tetrafluoroethylene-vinyl fluoride, polyvinylidene fluoride-trifluoroethylene-perfluoro (methyl vinyl ether), polyvinylidene fluoride-tetrafluoroethylene-perfluoro(methyl vinyl ether), polyvinylidene fluoride-trifluoroethylene-bromotrifluoroethylene, polyvinylidene fluoride-tetrafluoroethylene-bromotrifluoroethylene, polyvinylidene fluoride-trifluoroethylene-chlorofluoroethylene, polyvinylidene fluoride-tetrafluoroethylene-chlorofluoroethylene, polyvinylidene fluoride-trifluoroethylene-vinylidene chloride, and polyvinylidene fluoride-tetrafluoroethylene-vinylidene chloride.

15. The composite of claim 13, wherein said composite comprises particles of high-dielectric constant material suspended in said polymer matrix.

16. The composite of claim 15, wherein said particles of high-dielectric constant materials are uniformly distributed in said polymer matrix.

17. A composite material comprising:
    a polymer matrix; and
    at least one high-dielectric constant organic material having a dielectric constant higher than 1,000;
    wherein said polymer matrix is the copolymer P(VDF-TrFE) and said high-dielectric constant material is metallophthalocyanine oligomer.

18. A material comprising a polymer matrix comprising a dielectric constant measured at room temperature of at least 20 when measured in the frequency range from about 1 to about 100 Hz and at least one high-dielectric constant organic material having a dielectric constant higher than 1,000, wherein said polymer matrix and said high-dielectric constant material are chemically bonded to form said material.

19. The composite claim 18, wherein said composite has a dielectric constant higher than 400.

20. A high dielectric constant composite material prepared by a process comprising the steps of:
    solubilizing a polymer matrix comprising a dielectric constant measured at room temperature of at least 20 when measured in the frequency range from about 1 to about 100 Hz;
    adding at least one high-dielectric constant organic material having a dielectric constant higher than 1,000 to said polymer; and
    forming a film.

21. The composite material of claim 20, wherein said high dielectric constant material comprises at least one material selected form the group consisting of high dielectric constant semiconductor organic solids, metallophthalocyanine oligomer, ClAn/Cl$_4$Pa, and Pyrene/o-iodoBA.

22. A high dielectric constant composite material prepared by a process comprising the steps of:
    solubilizing a polymer matrix;
    adding at least one high-dielectric constant organic material having a dielectric constant higher than 1,000 to said polymer; and
    forming a film;
    wherein said polymer matrix comprises at least one ferroelectric polyvinylidine fluoride polymer, that has been processed to exhibit an electrostrictive strain of 3% or more when an electric field strength of 50 megavolts per meter or greater is applied thereacross.

23. The composite material of claim 22, wherein said polyvinylidene fluoride polymer is selected from the group of: polyvinylidene fluoride, polyvinylidene fluoride-trifluoroethylene P(VDF-TrFE), polyvinylidine tetrafluoroethylene P(VDF-TFE), polyvinylidine trifluoroethylene hexafluoropropylene P(VDF-TFE-HFE) and polyvinylidine hexafluoropropylene P(VDF-HFE).

24. A high dielectric constant composite material prepared by a process comprising the steps of:
    solubilizing a polymer matrix;
    adding at least one high-dielectric constant organic material having a dielectric constant higher than 1,000 to said polymer; and
    forming a film;
    wherein said polymer matrix comprises at least one terpolymer comprising at least one monomer of vinylidene-fluoride; at least one monomer selected from the group consisting of trifluoroethylene and tetrafluoroethylene; and at least one monomer selected from the group consisting of, vinyl fluoride, perfluoro (methyl vinyl ether); bromotrifluoroethylene, chlorofluoroethylene, chlorotrifluoroethylene, and hexafluoropropylene, and tetrafluoroethylene.

25. The composite material of claim 24, wherein said polymer matrix comprises at least one terpolymer selected from the group consisting of: polyvinylidene fluoride-trifluoroethylene-chlorotrifluoroethylene P(VDF-TrFE-CTFE), polyvinylidene fluoride-tetrafluoroethylene-chlorotrifluoroethylene, polyvinylidene fluoride-trifluoroethylene-hexafluoropropylene P(VDF-TrFE-HFP), polyvinylidene fluoride-tetrafluoroethylene-hexafluoropropylene, polyvinylidene fluoride-trifluoroethylene-tetrafluoroethylene, polyvinylidene fluoride-trifluoroethylene-vinyl fluoride, polyvinylidene fluoride-tetrafluoroethylene-vinyl fluoride, polyvinylidene fluoride-trifluoroethylene-perfluoro(methyl vinyl ether), polyvinylidene fluoride-tetrafluoroethylene-perfluoro(methyl vinyl ether), polyvinylidene fluoride-trifluoroethylene-bromotrifluoroethylene, polyvinylidene fluoride-tetrafluoroethylene-bromotrifluoroethylene, polyvinylidene fluoride-trifluoroethylene-chlorofluoroethylene, polyvinylidene fluoride-tetrafluoroethylene-chlorofluoroethylene, polyvinylidene fluoride-trifluoroethylene-vinylidene chloride, and polyvinylidene fluoride-tetrafluoroethylene-vinylidene chloride.

26. A composite material comprising:
    a polymer matrix; and
    at least one high-dielectric constant organic material having a dielectric constant higher than 1,000;
    wherein said high dielectric constant material is a metallophthalocyanine oligomer represented by the formula:

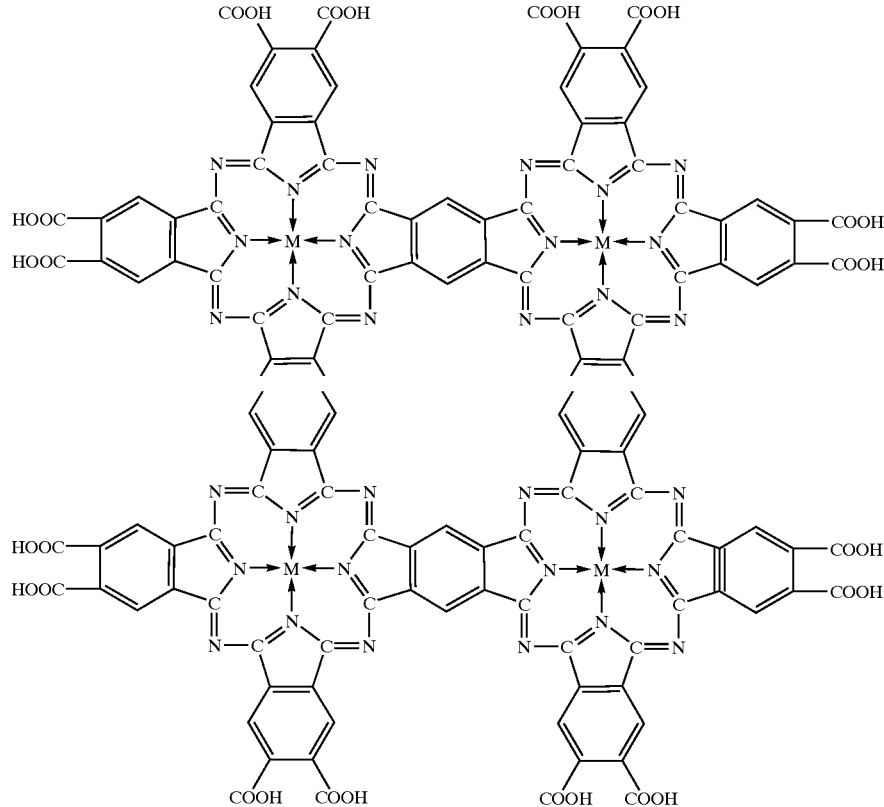

wherein M is a metal.

27. A composite material comprising:
    a polymer matrix; and
    at least one high-dielectric constant organic material having a dielectric constant higher than 1,000;
    wherein said high dielectric constant material is a metallophthalocyanine oligomer represented by the formula:

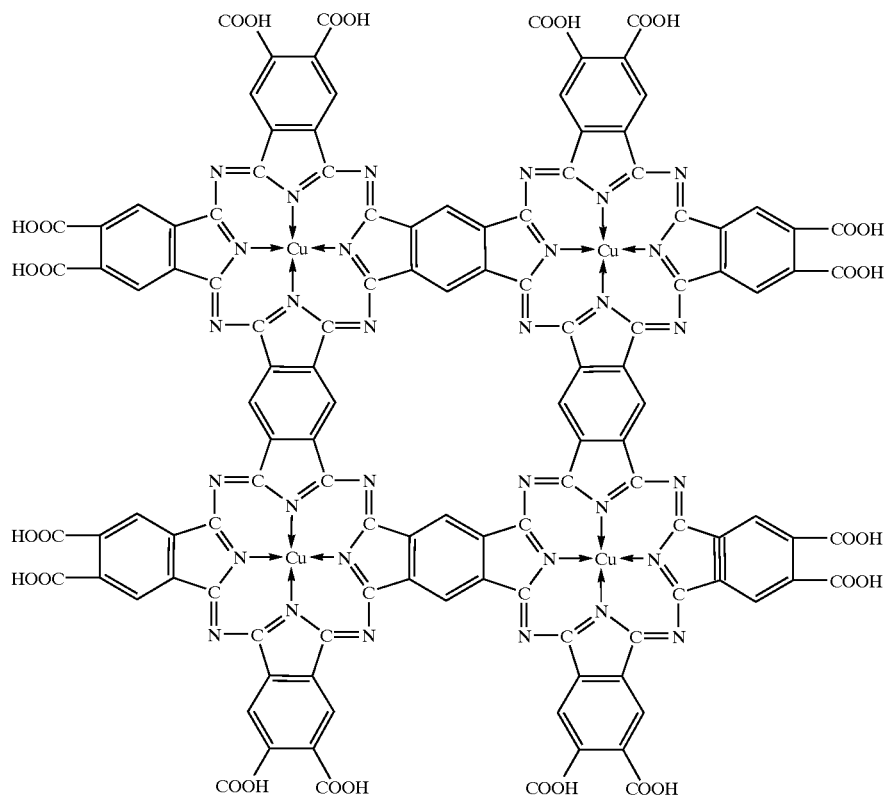

wherein Cu is copper.

28. A composite material comprising:

a polymer matrix; and at least one high-dielectric constant organic material having a dielectric constant higher than 1.000;

wherein said composite exhibits a strain of about 2% under an electric field of 13 MV/m or higher.

29. A material comprising a polymer matrix and at least one high-dielectric constant organic material having a dielectric constant higher than 1.000; wherein said Polymer matrix and said high-dielectric constant material are chemically bonded to form said material; and wherein said composite exhibits a strain of about 2% under an electric field of 13 MV/m or higher.

* * * * *